US012625799B2

(12) United States Patent
Partsch

(10) Patent No.: US 12,625,799 B2
(45) Date of Patent: May 12, 2026

(54) MEMORY DEVICE WITH STAGGERED ACCESS

(71) Applicant: Rambus Inc., San Jose, CA (US)

(72) Inventor: Torsten Partsch, Raleigh, NC (US)

(73) Assignee: Rambus Inc., San Jose, CA (US)

( * ) Notice: Subject to any disclaimer, the term of this patent is extended or adjusted under 35 U.S.C. 154(b) by 4 days.

(21) Appl. No.: 18/920,086

(22) Filed: Oct. 18, 2024

(65) Prior Publication Data

US 2025/0147875 A1     May 8, 2025

Related U.S. Application Data

(60) Provisional application No. 63/596,685, filed on Nov. 7, 2023.

(51) Int. Cl.
*G06F 12/02* (2006.01)
*G11C 29/42* (2006.01)
(52) U.S. Cl.
CPC .......... *G06F 12/0223* (2013.01); *G11C 29/42* (2013.01)
(58) Field of Classification Search
CPC .... G06F 12/0223; G06F 12/023; G06F 12/06; G06F 12/0879; G11C 29/42; G11C 7/22
See application file for complete search history.

(56) References Cited

U.S. PATENT DOCUMENTS

| | | | | |
|---|---|---|---|---|
| 4,222,112 A | * | 9/1980 | Clemons | G11C 11/4091 365/194 |
| 5,129,059 A | * | 7/1992 | Hannah | G09G 5/39 365/189.12 |
| 5,406,526 A | | 4/1995 | Sugibayashi et al. | |
| 6,147,898 A | * | 11/2000 | Yamada | G11C 11/419 365/156 |
| 6,825,841 B2 | | 11/2004 | Hampel et al. | |
| 6,914,841 B1 | * | 7/2005 | Thwaite | G11C 11/40611 365/205 |
| 6,925,028 B2 | | 8/2005 | Hosokawa et al. | |
| 7,170,808 B2 | | 1/2007 | Hokenmaier | |
| 7,518,942 B2 | | 4/2009 | Sunaga | |
| 8,411,523 B2 | | 4/2013 | Bains | |
| 9,330,735 B2 | | 5/2016 | Harris et al. | |

(Continued)

OTHER PUBLICATIONS

Chatterjee, Niladrish et al., "Architecting an Energy-Efficient DRAM System for GPUs," 2017 IEEE International Symposium on High Performance Computer Architecture (HPCA), Austin, TX, USA, 2017, pp. 73-84, doi: 10.1109/HPCA.2017.58. 12 pages.

*Primary Examiner* — Michael Krofcheck
(74) *Attorney, Agent, or Firm* — Amsel IP Law PLLC; Jason Amsel

(57) ABSTRACT

A memory device supports low power operation by facilitating staggered access to row segments within a row of a memory bank. Upon receiving an activate command to activate a row, the memory device sequentially activates a plurality of local wordlines associated with the row with a stagger interval between activations. Upon receiving an access command associated with the activated row, the memory device sequentially initiates column operations for respective row segments with the same stagger interval between the column operations. The memory device may furthermore facilitate error correction code operations in a staggered manner by sequentially performing computations associated with the different row segments.

20 Claims, 10 Drawing Sheets

Receive Activate Command to Activate Row
902

Sequentially Activate Local Wordlines of Row in Staggered Manner
904

Receive Access Command for Activated Row
906

Sequentially Initiate Column Operations for Access Command in Staggered Manner
908

(56)    References Cited

U.S. PATENT DOCUMENTS

| | | | |
|---|---|---|---|
| 2001/0008282 A1* | 7/2001 | Maeda | G11C 11/408 |
| | | | 365/185.23 |
| 2006/0215474 A1 | 9/2006 | Hokenmaier | |
| 2007/0076504 A1* | 4/2007 | Suh | G11C 11/40618 |
| | | | 365/222 |
| 2010/0036997 A1* | 2/2010 | Brewer | G06F 12/0811 |
| | | | 711/E12.082 |
| 2013/0201770 A1* | 8/2013 | Harris | G11C 11/4091 |
| | | | 365/189.011 |
| 2014/0014815 A1* | 1/2014 | Lee | H04N 25/7795 |
| | | | 327/126 |
| 2021/0020213 A1* | 1/2021 | Mirichigni | G11C 11/2275 |
| 2023/0367709 A1* | 11/2023 | Ayyapureddi | G06F 11/0727 |

* cited by examiner

Receive Activate Command to Activate Row
902

Sequentially Activate Local Wordlines of Row in Staggered Manner
904

Receive Access Command for Activated Row
906

Sequentially Initiate Column Operations for Access Command in Staggered Manner
908

MEMORY DEVICE WITH STAGGERED ACCESS

CROSS-REFERENCE TO RELATED APPLICATIONS

This application claims the benefit of U.S. Provisional Patent Application No. 63/596,685 filed on Nov. 7, 2023, which is incorporated by reference herein in its entirety.

BACKGROUND

Memory devices such as Dynamic Random-Access Memory (DRAM) are used in a wide variety of electronic devices. In battery powered systems or other low power applications, it can be desirable to reduce peak current of the memory device to lower power consumption, reduce stress on electronic components, and reduce undesirable electromagnetic effects.

BRIEF DESCRIPTION OF THE DRAWINGS

The teachings of the embodiments herein can be readily understood by considering the following detailed description in conjunction with the accompanying drawings.

DETAILED DESCRIPTION

A memory device supports low power operation by facilitating staggered access to row segments within a row of a memory bank. Upon receiving an activate command to activate a row, the memory device sequentially activates a plurality of local wordlines associated with the row with a stagger interval between activations. Upon receiving an access command associated with the activated row, the memory device sequentially initiates column operations for respective row segments with the same stagger interval between the column operations. The memory device may furthermore facilitate error correction code operations in a staggered manner by sequentially performing computations associated with the different row segments.

Figure 1:
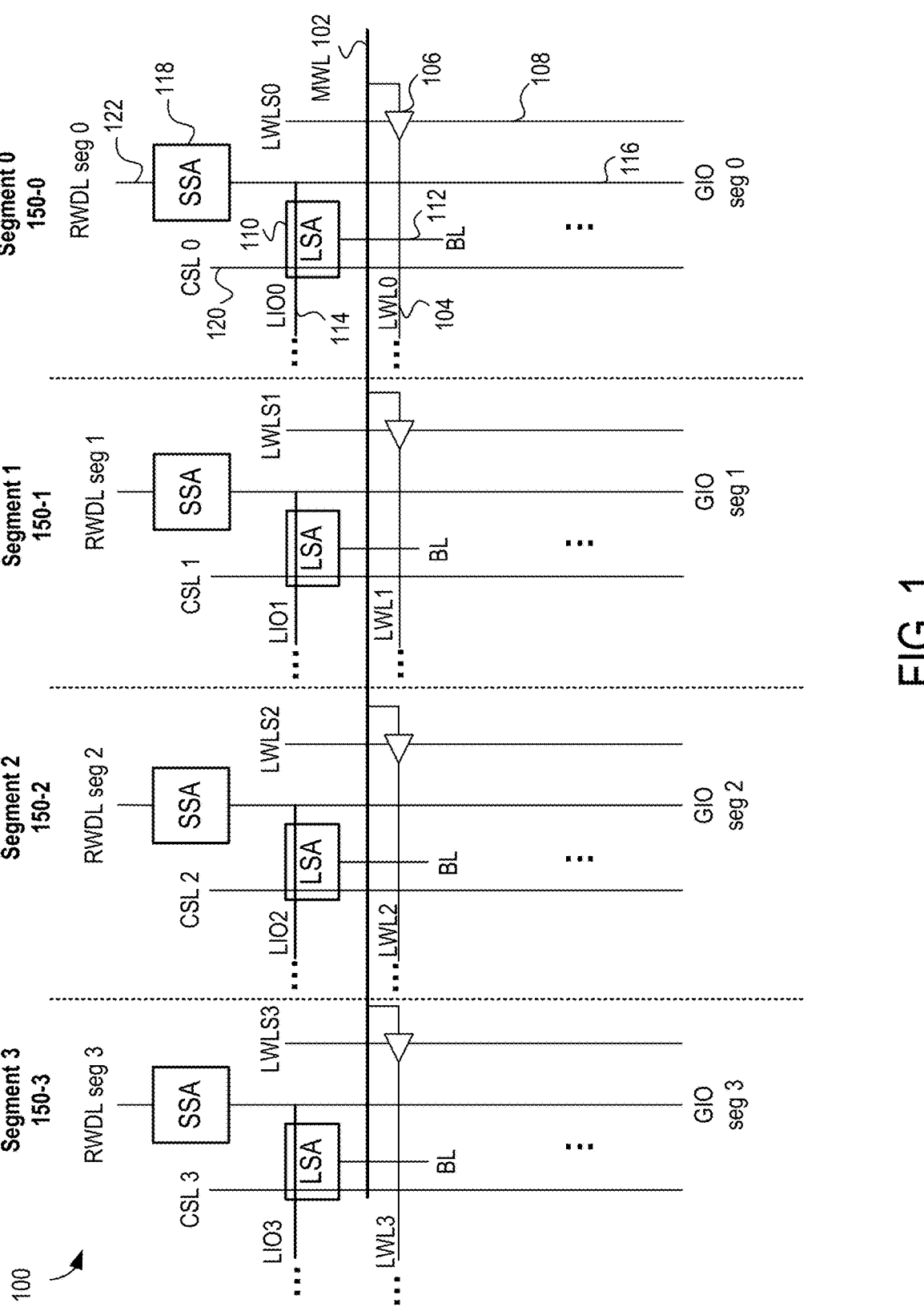
FIG. 1 is an example architecture of a bank for a memory device that supports staggered access to row segments of a row.

FIG. 1 illustrates an example schematic of a bank 100 for a memory device, such as a dynamic random-access memory (DRAM). The bank 100 includes an array of cells organized into rows and columns. The bank 100 may furthermore be organized into a plurality of segments 150 (e.g., four segments 150-1, 150-2, 150-3, 150-4) that each include a subset of the columns. FIG. 1 expressly illustrates only a single column in each segment 150, but segments 150 may include any number of columns with similar structures. Similarly, FIG. 1 expressly illustrates only a single row of the bank 100, but the bank 100 may include any number of rows with similarly structures.

Each row is associated with a master wordline (MWL) 102 that provides a master activation signal and each segment 150 of a row is associated with a respective local wordline (LWL) 104 driven by a respective local wordline driver 106. The local wordline drivers 106 are controlled by respective local wordline select (LWLS) lines 108 that selectively couple the master wordline 102 to the respective local wordlines 104. The local wordline select lines 108 may be shared between multiple rows and operate in conjunction with the master wordline 102 per row to activate a selected local wordline 104. Thus, a given local wordline 104 is activated when the corresponding master wordline 102 is activated and when the corresponding local wordline select line 108 is activated. This architecture enables local wordlines 104 in the same row to be activated or deactivated independently.

The columns of the bank 100 are associated with respective bitlines (BL) (or bitline pairs) 112 that each couple the cells in an activated local wordline 104 to a set of respective local sense amplifiers (LSAs) 110. The bitlines 112 and local sense amplifiers 110 may be shared across cells within the same column because only one row is activated at a time. The local sense amplifiers 110 sense voltages of the corresponding bitlines 112 during read operations and transfer voltages to the bitlines 112 for writing to cells during write operations. The local sense amplifiers 110 are coupled to respective local input/output (LIO) lines 114 associated with each local wordline 104, which couple to respective secondary sense amplifiers (SSAs) 118 via global input/output (GIO) lines 116. The global input/output lines 116 and secondary sense amplifiers 118 may be shared within each segment 150. Column select lines (CSL) 120 operate to select which local sense amplifiers 110 are coupled to the secondary sense amplifiers 118 via the local input/output lines 114 and the global input/output lines 116. The secondary sense amplifiers 118 may be read from or written to via respective local read/write data lines (RWDL) (e.g., organized per segment). For example, in a read operation, the column select lines 120 for one or more columns are asserted to cause voltages in the respective local sense amplifiers 110 for the selected columns to be transferred to the secondary sense amplifiers 118 via the respective local input/output lines 114 and global input/output lines 116. In a write operation, voltages are transferred from the secondary sense amplifiers 118 to the local sense amplifiers 110 via the respective global input/output lines 116 and the local input/output lines 114, and then stored to the respective cells via the bitlines 112. A single read or write command typically initiates column operations across multiple segments 150. Furthermore, read and write operations are performed in bursts such that within each segment 150, a single command sequentially activates multiple column select lines 120 and therefore causes multiple bits to be read from each segment 150 or written to each segment 150 per command.

Figure 2:
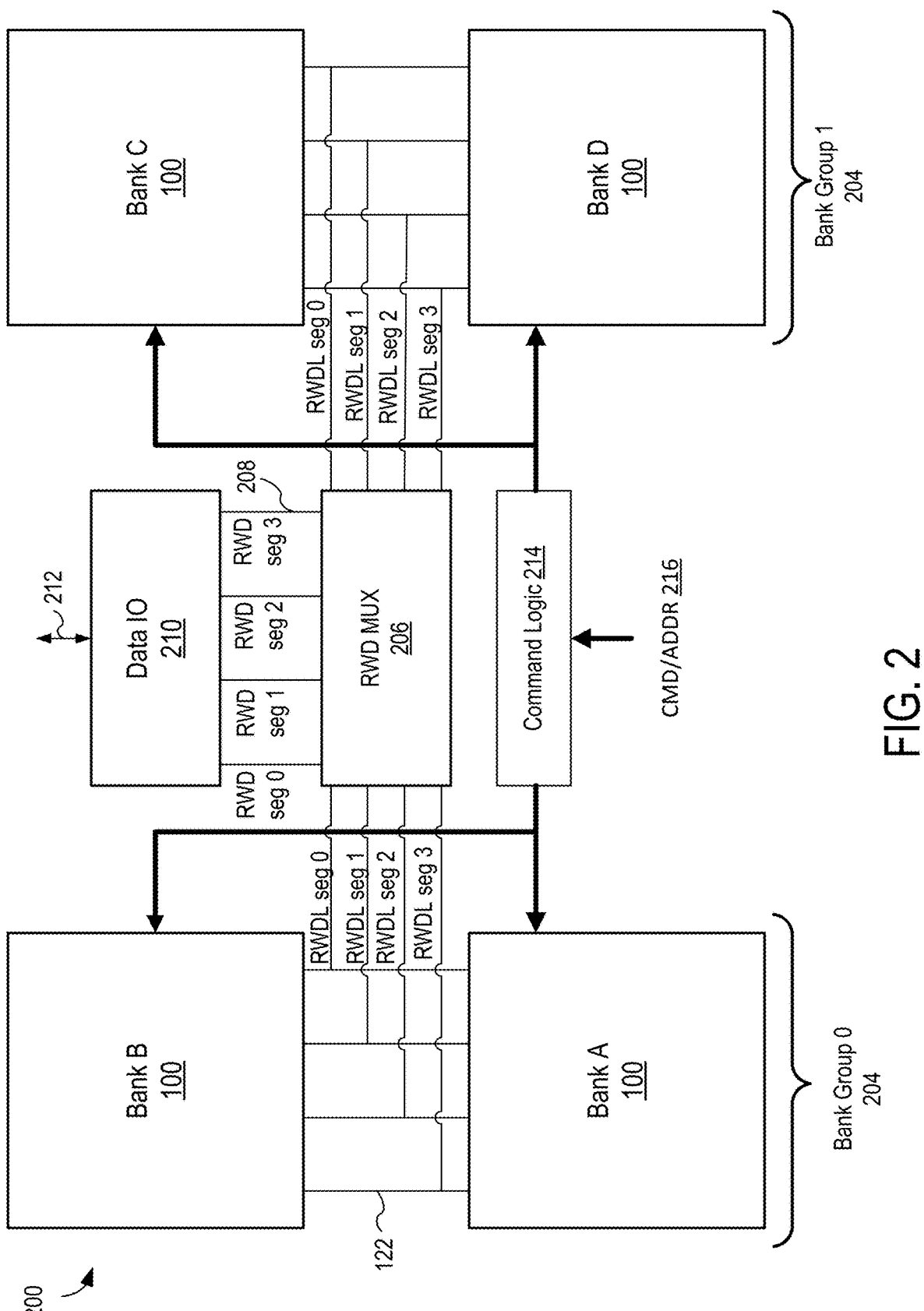
FIG. 2 is an example architecture of a memory device that supports staggered access to row segments of a row.

FIG. 2 illustrates an example embodiment of a memory device 200 with multiple banks 100 organized into bank groups 204. While FIG. 2 illustrates two bank groups 204 with two banks 100 each, the memory device 200 may include any number of banks 100 per bank group 204 and any number of bank groups 204. In this architecture, the local read/write data lines 122 per segment may be shared between banks 202 within a bank group 204. A read/write data multiplexer (RWD mux) 206 switches the local read/write data lines 122 for each bank group 204 to a set of global read/write data lines 208 (RWD) (e.g., organized per segment) coupled to a data input/output interface 210. The data input/output interface 210 may couple externally to data lines 212 for transferring data between the memory device 200 and a memory controller.

FIG. 2 also illustrates command logic 214 associated with the memory device 200. The command logic 214 receives a command/address signal 216 that specifies memory commands to be performed by the memory device 200 (e.g., activate command, read command, write command, precharge command, etc.) and, where applicable, an address associated with the commands. The address may include, for example, a bank group, a bank, a row address, and a column address. In a practical implementation, at least some aspects of the command logic 214 may be distributed and operate in association with individual banks 100. For example, the command logic 214 may include respective row decoders associated with each bank 100 that control activations of the respective master wordlines 102 and local wordline select lines 108 within each bank 100 based on a received row address, and may include column decoders per bank 100 that control the column select lines 120 within each bank 100 based on a received column address.

Figure 3:
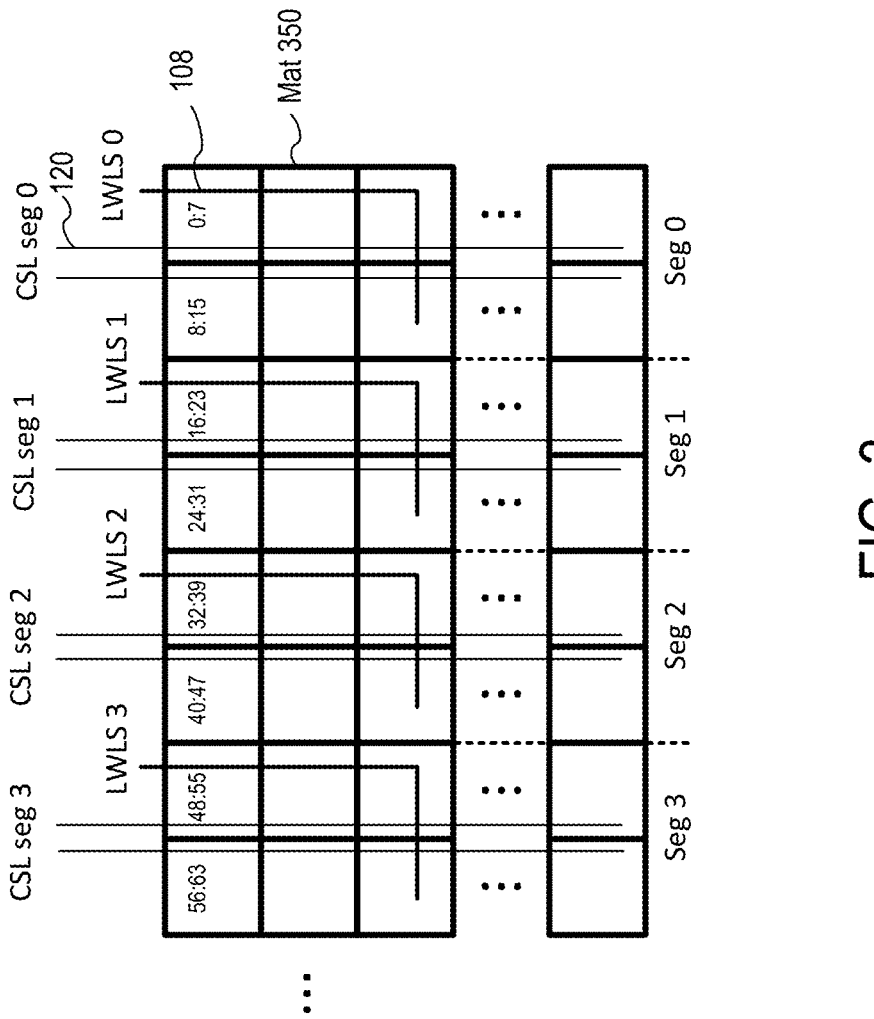
FIG. 3 is an example embodiment of a bank layout of a memory device in an x4 configuration that supports staggered access to row segments of a row.

FIG. 3 illustrates an example bank layout for a memory device 200. In this view, the cell arrays are organized into mats 350 that each comprise an array of cells arranged in rows and columns, a set of local wordline drivers 106 for driving the rows of cells in the mat 350, and a set of local sense amplifiers 110 for performing sensing during read and write operations associated with cells in the mat 350. In one mat architecture, the local wordline drivers 106 may be arranged in peripheral columns (e.g., along the left and right edges of each mat 350) and the local sense amplifiers 110 may be arranged in peripheral rows (e.g., along the top and bottom edges of each mat 350). A mat 350 thus provides a repeatable structural unit for implementing a memory bank 100.

FIG. 3 also shows column select lines 120 and local wordline select lines 108. For simplicity, the set of column select lines 120 and the set local wordline select lines 108 within each segment are represented by respective single lines per segment. In this example, the memory device 200 is configured in a x4 configuration with a burst length of 16 such that each memory access reads or writes 64 bits (16 bits per segment for a set of four segments). The column select lines 120 and local wordline select lines 108 each are grouped over two mats 350 per row, with each mat 350 supplying 8 bits of read or write data per access. The local wordline select lines 108 for those two mats are controlled by the same set of LWLS lines.

Figure 4:
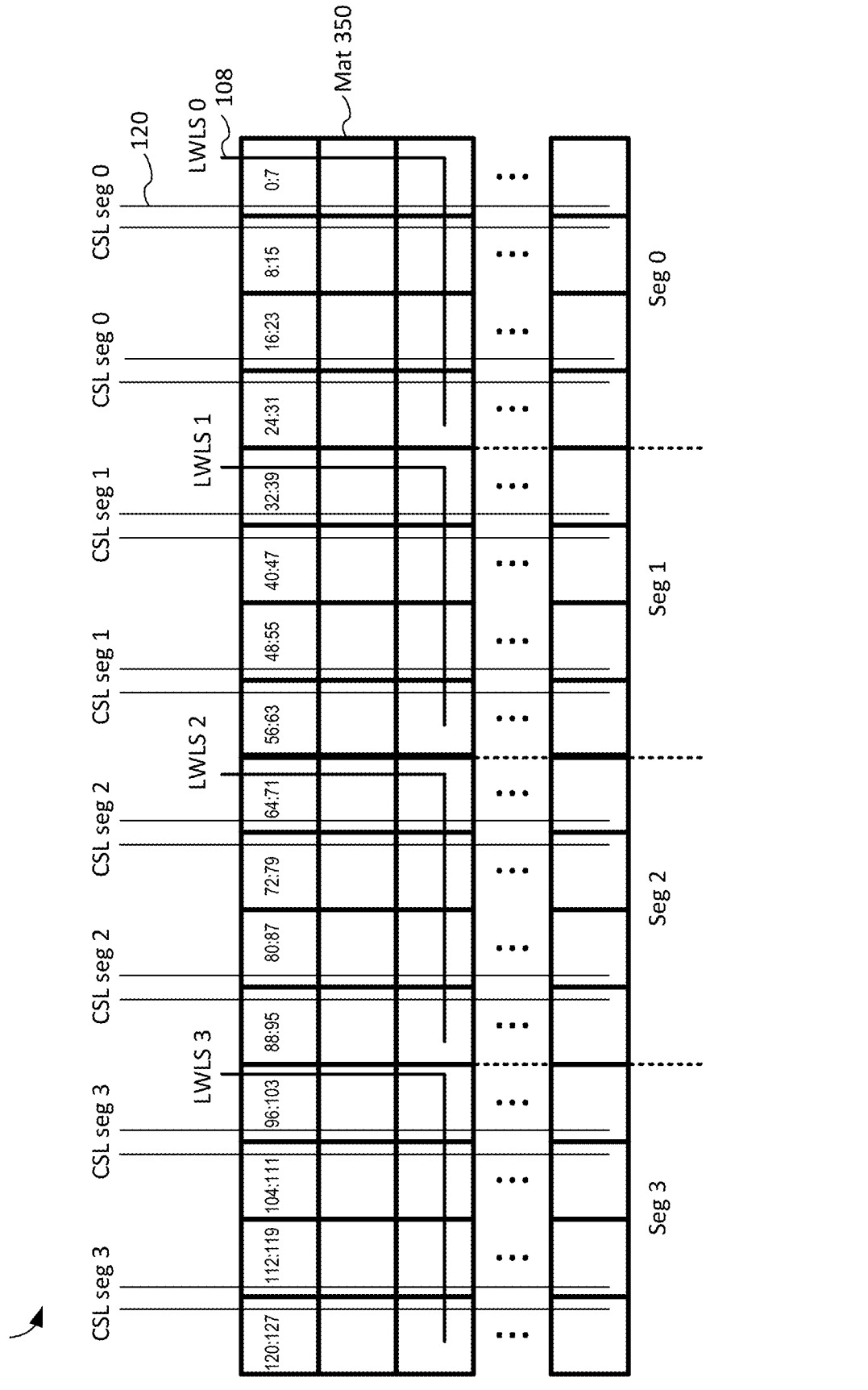
FIG. 4 is an example embodiment of a bank layout of a memory device in an x8 configuration that supports staggered access to row segments of a row.

FIG. 4 illustrates a similar bank layout for a memory device 200 in an x8 configuration such that each memory access reads or writes 128 bits (32 bits per segment for a set of four segments). In this configuration, the column select lines 120 and local wordline select lines 108 may span four mats 350 per row, with each mat 350 contributing 8 bits per access.

As described above with respect to FIGS. 1-4, the local wordlines 104 for different segments are independently controllable via the local wordline select lines 108. This enables different local wordlines 104 of the same row to be activated at different times. In an example operation scheme, the memory device 200 may enable staggered accesses in which activation of different local wordlines 104 of a row are activated sequentially with a fixed or other predefined stagger delay interval in between activations. For example, in a configuration with four segments 150, the memory device 200 may sequentially activate a first wordline segment 0, followed by second wordline segment 1, followed by a third wordline segment 2, followed by a fourth wordline segment 3 with a predefined stagger interval in between each activation. In a similar fashion, the column operations (e.g., read or write) initiated via the column select lines 120 may be performed in a staggered sequence per segment. For example, the memory device 200 may sequentially initiate a column operation for segment 0, followed by a column operation for segment 1, followed by a column operation for segment 2, followed by a column operation for segment 3. In an embodiment, the same stagger interval may be employed between activation of wordline segments and between column operations associated with the respective segments. The staggered activation may be implemented, for example, via a series of delay elements linking the respective local wordline select lines 108 and linking the respective column select lines 120 between different segments, such that activation of a first local wordline select line 108 (or master wordline 102) or column select lines 120 propagate to subsequent local wordline select lines 108 or column select lines 120 after the predefined stagger interval. Alternatively, the command logic 214 may independently control timing of activating each local wordline select line 108 and/or column select line 120.

Staggering the row activations and column operations in this manner reduces the peak current associated with these operations relative to a concurrent activation and/or column operation of all segments. The specific stagger interval may be configured to achieve a desired peak current limitation. For example, the stagger interval may be set such that the current associated with operation of a first segment declines from its peak by a desired amount prior to initiating the operation associated with the next segment.

In an embodiment, the stagger interval may be configurable via a register of the memory device, via a switch external to the memory device (e.g., on a memory module), or via a command from a memory controller. In an embodiment, the memory device 200 may be modally configurable between a non-staggered access mode in which segments are activated concurrently and column operations for different segmented are initiated concurrently (i.e., the stagger interval is set to zero), and a staggered access mode in which row activation and column operations are staggered per segment. In a further embodiment, the specific stagger interval May be configurable (e.g., by setting a register value) in the staggered access mode.

Figure 5:
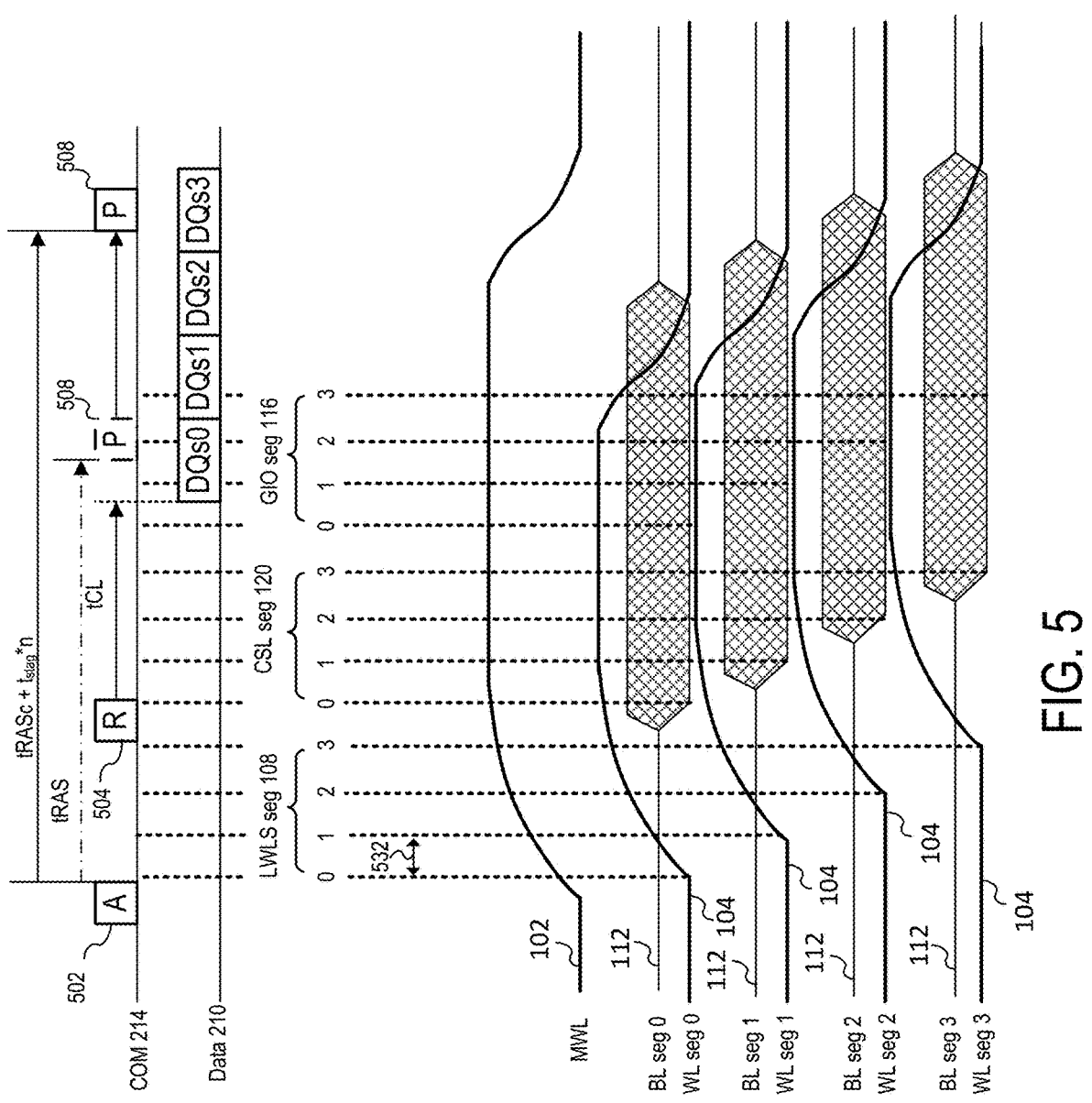
FIG. 5 is a timing diagram associated with staggered access to row segments in a memory device.

FIG. 5 illustrates an example timing diagram associated with operation of a memory device 200 that enables staggered access. An activate command ("A") 502 to activate a row of a bank 100 (as indicated by a row address in the activate command) is received by the command logic 214 (e.g., from a memory controller). In response to the activate command 502, the memory device activates a master wordline 102 associated with the row. The memory device 200 furthermore activates the local wordline drivers 106 associated with different local wordlines 104 of the row in a staggered manner via respective local wordline select lines 108 per segment. A predefined stagger delay interval 532 may be introduced in between activating the respective local wordlines 104. For example, wordline segment 0 may be activated concurrently with or soon thereafter activating the master wordline 102, wordline segment 1 may be activated a stagger delay interval 532 after activating wordline segment 0, wordline segment 2 may be activated a stagger delay interval 532 after activating wordline segment 1, and wordline segment 3 may be activated a stagger delay interval 532 after activating wordline segment 2.

After the activate command 502, a column operation command 504 (in this example a read command) may be received. The read command 504 operates to sequentially initiate column operations (via column select lines 120) of different segments in a staggered manner. The respective column select lines 120 may be activated in the same segment order and with the same stagger delay interval 532 as the previously described activate command 502. For example, upon receiving the read command 504, the memory device may activate column select lines 120 for segment 0, activate column select lines 120 for segment 1 after a stagger delay interval 532, activate column select lines 120 for segment 2 after another stagger delay interval 532, and activate column select lines 120 for segment 3 after another stagger delay interval 532.

Following activation of the column select lines 120, data associated with each segment is read to the GIO lines 116 for the respective segments, where the data is further sensed and amplified by the SSAs 118, and then passed to the data I/O interface 210 via the local read/write lines 122, read/write mux 206, and global read/write lines 208. The total delay between receiving the read command 504 and the data for the first segment (DQs0) being output by the data I/O interface 210 is given by tCL. Here, tCL need not be increased relative to a non-staggered access in which all segments are activated concurrently if the stagger delay tSTAG is less than tCCDs/n, where n is the number of stagger intervals employed and tCCD is column-to-column delay representing the minimum allowable time between successive column operations. The minimum allowable time (tRAS) between receiving the activate command 592 and executing a precharge command 508 following the column operation may increase in the staggered access mode relative to a concurrent access mode based on the sum of the respective stagger intervals. For example, if in a concurrent access mode, the next precharge 508 can occur after a time tRAS (based on timing constraints of the memory device 200), the staggered access mode enforces a delay of tRAS+ tSTAG*n until the next precharge 508 to account for the additional delay between the end of the first column operation and the last staggered column operation. These timing considerations may be enforced by the memory device 200, by the memory controller, within an external buffer device between the memory device 200 and the memory controller, or a combination thereof. The operations described above may similarly apply for read operations and write operations.

Figure 6:
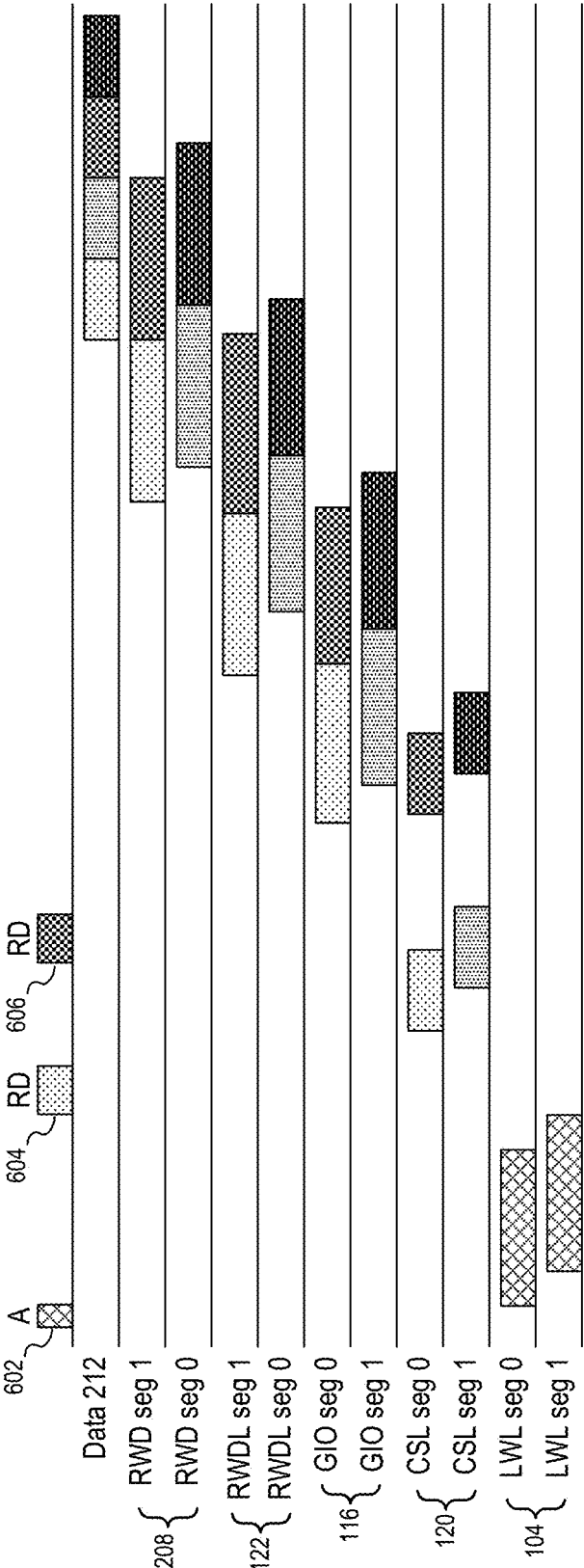
FIG. 6 is a timing diagram associated with back-to-back accesses to a row of a memory device with staggered access, when the burst order is kept the same.

FIG. 6 is a timing diagram associated with a staggered memory access for back-to-back read accesses to the same wordline segment where both reads are configured with the same burst order. In this example, signals associated with only two segments are shown (seg 0, seg 1). An activate command ("A") 602 is received at the data I/O interface 210 to activate a row of a bank 100 (as indicated by a row address in the activate command 602). In response to the activate command 602, the memory device 200 activates (via respective local wordline select lines 108 per segment) the local wordline drivers 106 associated with different local wordlines 104 (LWL seg 0, LWL seg 1) of the row in a staggered manner. A predefined stagger delay interval may be introduced in between activating the respective wordline segments. A read command 604 is later received, which initiates staggered activation of column select lines 120 (CSLseg0, CSLseg1) for the different segments. Here, the column select lines 120 are activated in the same segment order and according to the same stagger interval as the wordline segment activations. A second read command 606 associated with the same wordline segment (which is already activated) may be subsequently issued, resulting in additional staggered activations of relevant column select lines 120 for the segment (CSLseg0, CSLseg1). The read data for the back-to-back read operations propagate through the respective GIO lines 116 (GIO seg0, GIOseg1), RWDL lines 122 (RWDLseg0, RWDLseg1), and RWD lines 208 (RWDseg0, RWDseg1) and are outputted by the data I/O interface as read data 212. If the burst order between the back-to-back read commands 604 is kept the same, the staggered access can be performed without introducing any additional minimum delay between the read accesses relative to a non-staggered (e.g., concurrent) access. For example, the delay in initiating the column operation for CSL seg 1 in association with the first read operation 604 will not interfere with the column operation for CSL seg 1 in the second read operation 604 because they are both delayed by the same stagger delay.

Figure 7:
FIG. 7 is a timing diagram associated with back-to-back accesses to a row of a memory device with staggered access, when the burst order changes.

FIG. 7 is another timing diagram associated with a staggered memory access for back-to-back read accesses to the same wordline segment where the second read 706 is configured for a different burst order than the first read 604. In this example, the first burst order associated with the first read 604 results in data from segment 0 being read before data from segment 1, while the different burst order associated with the second read 706 results in data from segment 1 being outputted before data from segment 0. In this example, the memory device 200 (or memory controller or buffer device) may impose a longer minimum delay between the back-to-back read accesses to ensure that an access to a segment in the first read operation 604 does not interfere with a read access to the same segment in the second read operation 706. This interference may arise, for example, if based on the different burst orders, a column access for a segment is delayed in the first read operation 604 (e.g., CSL seg 1), and is not delayed in the second read operation 706 (e.g., because it is first in the sequence in the burst order for the second read operation 706). To avoid such interference, the memory device 200, buffer device, and/or memory controller may impose a longer minimum delay for back-to-back memory accesses to the same wordline segment with different burst orders than similar back-to-back accesses to the same wordline segment with the same burst order. For example, in one embodiment, the memory device 200 and/or memory controller impose a minimum delay of tCCDb=tCCD+tSTAG for back-to-back memory accesses to the same wordline segment with different burst orders.

Similar timing considerations relate to back-to-back memory accesses for wordline segments in different bank groups. For example, staggered accesses can generally occur without impacting timing considerations when the burst order between the back-to-back accesses are kept the same. When the burst order changes between back-to-back staggered accesses to wordline segments in different bank groups, an additional minimum delay may be imposed between the accesses to avoid potential interference. Furthermore, timing considerations associated with write operations may be constrained similarly to read operations as described above.

Figure 8:
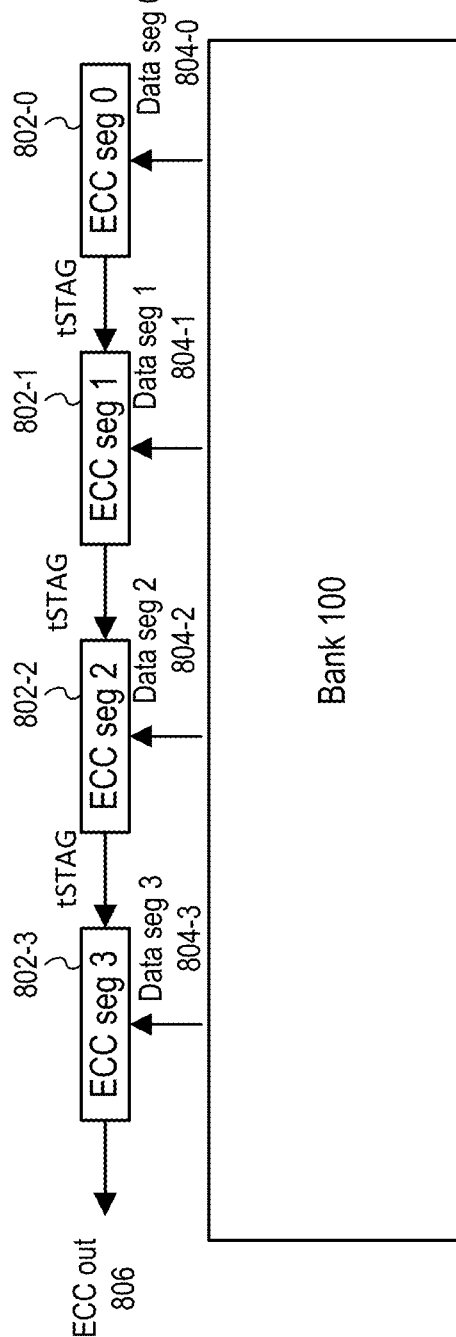
FIG. 8 is a block diagram of error correction code logic for a memory device that enables staggered access.

FIG. 8 illustrates an example embodiment of error correction code (ECC) logic associated with a memory device 200 configured for staggered access. Here, the memory device 200 includes a set of ECC logic units 802 including one logic unit 802 per segment to operate on data from respective segments as it is output by the bank 100. The first ECC logic unit 802-0 obtains the read data associated with a first segment (data seg 0) 804-0, performs an ECC computation associated with the bits of the first data segment 804-0, and passes the result to the next ECC logic unit 802-1. The second ECC logic unit 802-1 performs an ECC computation based on the results from the first ECC logic unit 802-0 combined with the bits of the second data segment 804-1 once they become available (after the stagger interval tSTAG). Additional ECC logic units 802-2, 802-3 operate similarly to combine results from the previous logic unit 802 with the corresponding data segment to generate the output ECC code 806. The output of each ECC logic unit 802 may be latched until the next ECC logic unit 802 is ready to perform the next ECC computation (e.g., ECC logic unit 802-0 may latch its output until ECC logic unit 802-1 is ready). Alternatively, the output of the prior ECC logic unit 802 in the sequence may be latched at the input of the next ECC logic unit 802 (e.g., ECC logic unit 802-1 may latch the output from ECC logic unit 802-0 until ECC logic unit 802-1 is ready).

Similar ECC logic 802 may be employed for write operations. Here, the write data is instead received from data interface I/O 210 and may be processed through the sequence of ECC logic units 802 in a staggered manner as it is being written to the bank 100.

Figure 9:
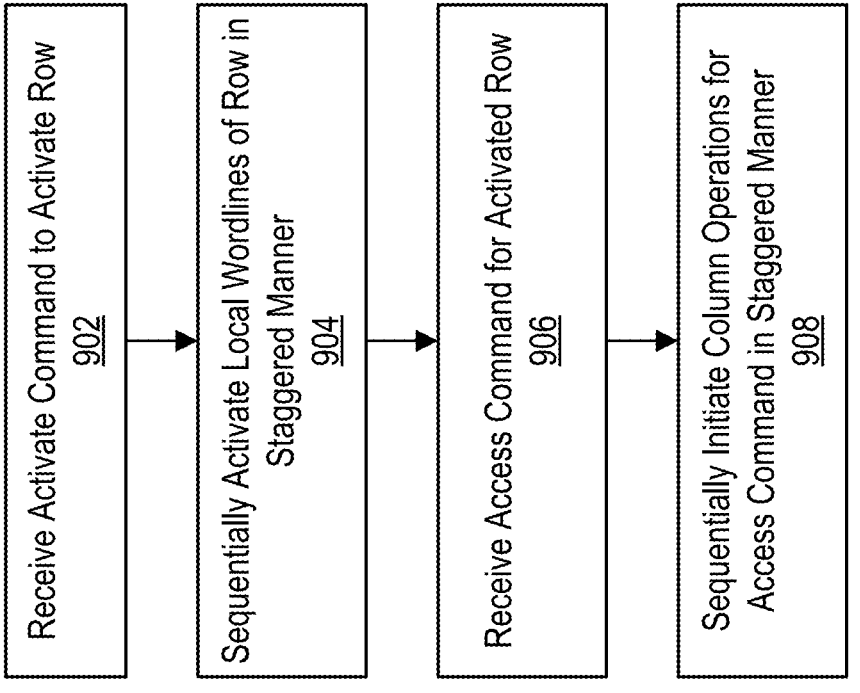
FIG. 9 is a flowchart illustrating an example embodiment of a process for operating a memory device in a staggered access mode.

FIG. 9 is a flowchart illustrating an example embodiment of a process for operating a memory device in a staggered access mode. The memory device 200 receives 902 an activate command via a command/address interface 216 (e.g., from a memory controller) for activating a master wordline 102 for a row of a bank 100. Responsive to the activate command, the command logic 214 sequentially activates 904 a plurality of local wordlines 104 with a stagger interval between activations. Following the activate command, the memory device 200 receives 906 an access command (e.g., a read or write) from the command/address interface 216 to access data associated with the activated row. Responsive to the access command, the command logic 214 sequentially 908 initiates column operations from respective row segments of the activated row with the stagger interval between the column operations.

Figure 10:
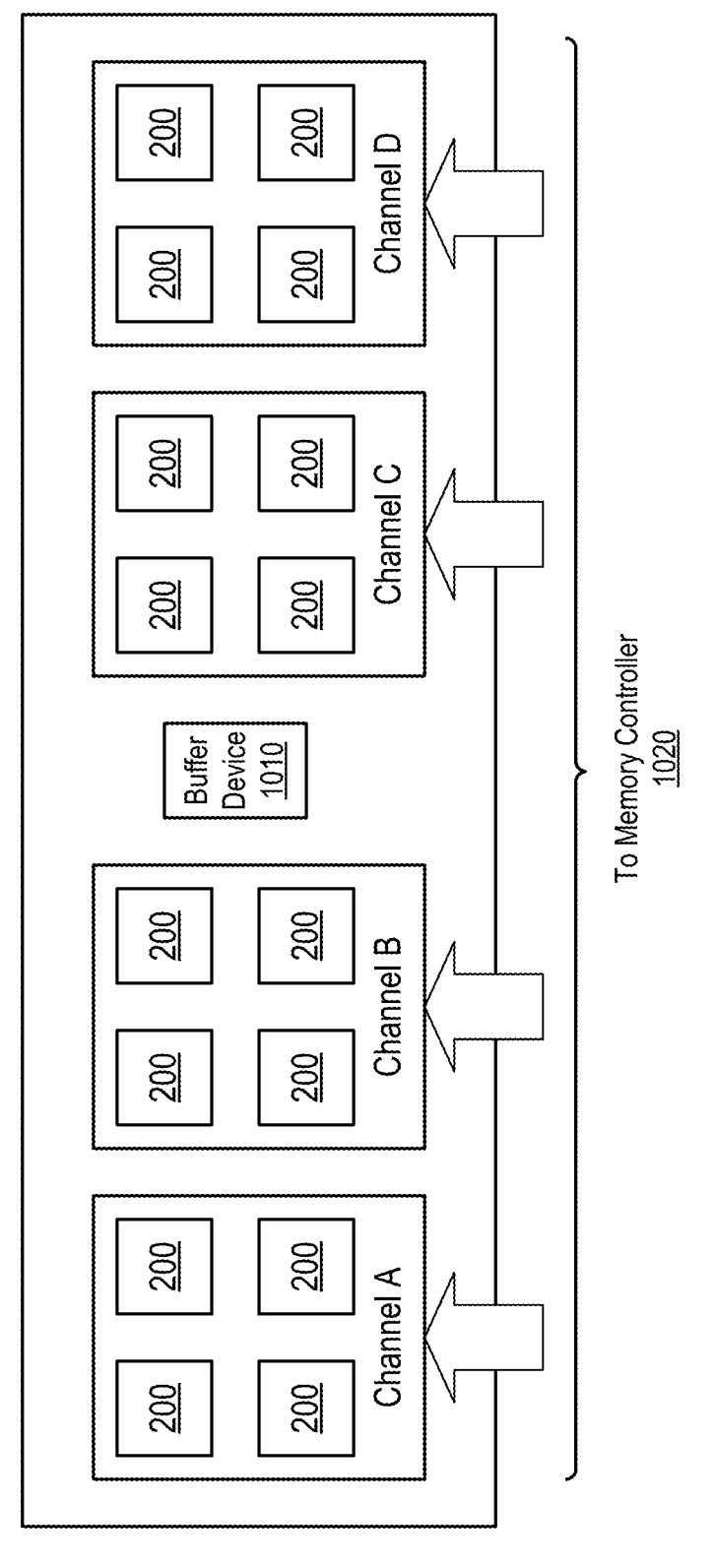
FIG. 10 is an example embodiment of a memory module supporting staggered access.

FIG. 10 illustrates an example embodiment of a memory module 1000 incorporating a plurality of memory devices 200 described above that may be configured for staggered access. The memory module 1000 includes a buffer device 1010 and a plurality of memory devices 200 organized into channels. The buffer device 1010 communicates command/address, clock, or other control signals (not shown) between a memory controller 1020 and the set of memory devices 200. In this example, the memory module 1000 comprises four channels (e.g., channels A-D) that may independently communicate with the memory controller 1020 and four memory devices 200 per channel. Alternative embodiments may include different numbers of channels or different numbers of memory devices 200 per channel.

In an alternative embodiment, the command logic 214 that controls the staggered activations of the local wordlines 104 and staggered initiation of the column operations may be at least partly implemented in the buffer device 1010 instead of in the memory devices 200. Here, the buffer device 1010 may receive activate commands, read/write commands, or other commands from the memory controller 1020 and may issue commands to the memory devices 200 that operate to independently control various segments in the same manner described herein.

A memory system including the described memory device 200 and/or memory module 1000 may be deployed in various types of computing systems. For example, an embodiment of such a memory device 200 or memory module 1000 may be deployed in an augmented reality or virtual reality headset or various low power applications where low peak current is desirable.

Upon reading this disclosure, those of ordinary skill in the art will appreciate still alternative structural and functional designs and processes for the described embodiments, through the disclosed principles of the present disclosure. Thus, while embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the scope of the disclosure as defined in the appended claims.

What is claimed is:

1. A memory device comprising:
an array of memory cells;
a master wordline for a row of the array;
a plurality of local wordlines independently drivable from the master wordline, each of the local wordlines associated with respective row segments of the row;
command logic to sequentially activate respective ones of the plurality of local wordlines responsive to an activate command for the row with a stagger interval between activations of the plurality of local wordlines, and the command logic further to receive a first access command and to sequentially initiate column operations to access data from the respective row segments with the stagger interval between the column operations.

2. The memory device of claim 1,
wherein the command logic is configured to execute a second access command having a same burst order as the first access command, and wherein the command logic enforces a first minimum time interval between the first access command the second access command; and
wherein the command logic is configured to execute a third access command having a different burst order than the second access command, and wherein the command logic enforces a second minimum time interval between the second access command the third access command, the second minimum time interval longer than the first minimum time interval.

3. The memory device of claim 1, wherein the stagger interval is at least as long as a burst period associated with the first access command.

4. The memory device of claim 1, wherein the command logic is configurable between a staggered access mode and a non-staggered access mode, wherein in the non-staggered access mode, the command logic is configured to concurrently activate the respective ones of the plurality of local wordlines responsive to the activation of the master wordline, and wherein the command logic is configured to concurrently initiate the column operations.

5. The memory device of claim 4, wherein a minimum latency between initiating the column operations and outputting the data is the same in the staggered access mode and the non-staggered access mode.

6. The memory device of claim 4, wherein a minimum interval between the activation of the master wordline and a subsequent precharge operation is longer in the staggered access mode than the non-staggered access mode.

7. The memory device of claim 1, wherein the command logic includes a register for controlling a duration of the stagger interval.

8. The memory device of claim 1, further comprising: error correction code logic to obtain the data from the respective row segments in a staggered sequence of data segments, and to sequentially perform an error correction code function on each of the data segments to generate an error correction code for the data.

9. A memory module comprising:
a plurality of memory devices on a printed circuit board, wherein the plurality of memory devices each comprise:
an array of memory cells;
a master wordline for a row of the array;
a plurality of local wordlines independently drivable from the master wordline, each of the local wordlines associated with respective row segments of the row; and
command logic to sequentially activate respective ones of the plurality of local wordlines responsive to activate command for the row with a stagger interval between activations of the plurality of local wordlines, and the command logic further to receive a first access command and to sequentially initiate column operations to access data from the respective row segments with the stagger interval between the column operations.

10. The memory module of claim 9,
wherein the command logic is configured to execute a second access command having a same burst order as the first access command, and wherein the command logic enforces a first minimum time interval between the first access command the second access command; and
wherein the command logic is configured to execute third second access command having a different burst order than the second access command, and wherein the command logic enforces a second minimum time interval between the second access command and the third access command, the second minimum time interval longer than the first minimum time interval.

11. The memory module of claim 9, wherein the stagger interval is at least as long as a burst period associated with the first access command.

12. The memory module of claim 9, wherein the command logic is configurable between a staggered access mode and a non-staggered access mode, wherein in the non-staggered access mode, the command logic is configured to concurrently activate the respective ones of the plurality of local wordlines responsive to the activation of the master wordline, and wherein the command logic is configured to concurrently initiate the column operations.

13. The memory module of claim 12, wherein a minimum latency between initiating the column operations and outputting the data is the same in the staggered access mode and the non-staggered access mode.

14. The memory module of claim 12, wherein a minimum interval between the activation of the master wordline and a subsequent precharge operation is longer in the staggered access mode than the non-staggered access mode.

15. The memory module of claim 9, wherein the command logic includes a register for controlling a duration of the stagger interval.

16. The memory module of claim 9, wherein the plurality of memory devices further each comprise:
error correction code logic to obtain the data from the respective row segments in a staggered sequence of data segments, and to sequentially perform an error correction code function on each of the data segments to generate an error correction code for the data.

17. A method for operating a memory device comprising:
receiving a first activate command via a command interface of the memory device for activating a master wordline for a row of an array of memory cells;
responsive to the first activate command, sequentially activating a plurality of local wordlines with a stagger interval between activations of the plurality of local wordlines, wherein the plurality of local wordlines are independently drivable from the master wordline;
receiving a first access command from the command interface; and
responsive to the first access command, sequentially initiating first column operations to access data from respective row segments associated with the plurality of local wordlines with the stagger interval between the column operations.

18. The method of claim 17, further comprising:
receiving a second access command from the command interface having a same burst order as the first access command;
executing the second access command while enforcing a first minimum time interval between executions of the first access command the second access command;
receiving a third access command from the command interface having a different burst order than the second access command; and
executing the third access command while enforcing a second minimum time interval between executions of the second access command the third access command, wherein the second minimum time interval longer than the first minimum time interval.

19. The method of claim 17, wherein the stagger interval is at least as long as a burst period associated with the first access command.

20. The method of claim 17, further comprising:
switching operation of the memory device from a staggered access mode to a non-staggered access mode;
receiving a second activate command via the command interface in the non-staggered access mode;
executing the second activate command by concurrently activating the plurality of local wordlines;
receiving a second access command via the command interface in the non-staggered access mode; and
executing the second access command by concurrently initiating second column operations associated with each of the row segments.

* * * * *